United States Patent
Essaian et al.

(10) Patent No.: US 6,355,544 B1
(45) Date of Patent: Mar. 12, 2002

(54) SELECTIVE HIGH CONCENTRATION DOPING OF SEMICONDUCTOR MATERIAL UTILIZING LASER ANNEALING

(75) Inventors: Stepan Essaian, San Jose, CA (US); Abdalla A. Naem, Overijse (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/620,481

(22) Filed: Jul. 20, 2000

(51) Int. Cl.$^7$ .......................... H01L 21/26; H01L 21/42
(52) U.S. Cl. ..................... 438/535; 438/312; 438/378; 438/510; 438/542; 438/557; 438/558
(58) Field of Search .................. 438/312, 510, 438/542, 550, 557, 558, 563, 378, 535, 536, 308

(56) References Cited

U.S. PATENT DOCUMENTS

| | | | |
|---|---|---|---|
| 4,415,383 A | 11/1983 | Naem et al. ............ | 148/187 |
| 4,431,459 A | * 2/1984 | Teng .................... | 438/308 |
| 4,561,906 A | * 12/1985 | Calder et al. .......... | 438/600 |
| 5,569,624 A | * 10/1996 | Weiner ................. | 438/285 |
| 5,918,140 A | * 6/1999 | Wickboldt et al. ...... | 438/535 |

OTHER PUBLICATIONS

Joshi et al, "Masking Technique for Laser Induced Diffusion", IBM Technical Disclosure Bulletin, vol. 14, No. 4, Sep. 1970, p. 928.*

Katsuyoshi Washio, "SiGe HBTs and ICs for Optical–Fiber Communication Systems", Solid–State Electronics 43 (1999) pp. 1619–1625.

Stanley Wolf, Ph.D. et al., "Silicon Processing For The VLSI Era", vol. 1: Process Technology, Second Edition, pp. 427–428.

* cited by examiner

*Primary Examiner*—Caridad Everhart
*Assistant Examiner*—Craig P. Lytle
(74) *Attorney, Agent, or Firm*—Stallman & Pollock LLP

(57) ABSTRACT

Extremely high dopant concentrations are uniformly introduced into a semiconductor material by laser annealing aided by an anti-reflective coating (ARC). A spin-on-glass (SOG) film containing dopant is formed on top of the semiconductor material. An ARC is then formed over the doped SOG layer. Application of radiation from an excimer laser to the ARC heats and melts the doped SOG film and the underlying semiconductor material. During this melting process, dopant from the SOG film diffuses uniformly within the semiconductor material. Upon removal of the laser radiation, the semiconductor material cools and crystallizes, evenly incorporating the diffused dopant within its lattice structure. The ARC suppresses reflection of the laser by the doped material, promoting efficient transfer of energy from the laser to heat and melt the underlying doped layer and semiconductor material. The present process is especially suited for introducing extremely high levels of conductivity-altering dopant ($10^{20}$–$10^{21}$ atoms/cm$^3$) into the polysilicon emitter of a heterojunction bipolar transistor device.

17 Claims, 2 Drawing Sheets

SELECTIVE HIGH CONCENTRATION DOPING OF SEMICONDUCTOR MATERIAL UTILIZING LASER ANNEALING

BACKGROUND OF THE INVENTION

1. Field of the Invention

The present invention relates to a method of introducing high concentrations of dopant into semiconductor material and, in particular, to a process for doping semiconductor material through melting and recrystallization by laser radiation aided by an anti-reflective coating.

2. Description of the Related Art

Heterojunction bipolar transistors (HBT) are finding increased use in semiconductor manufacturing due to the emergence of band gap engineering to control conductance.

FIGS. 1A–1F illustrate cross-sectional views of a conventional process flow for forming an HBT.

FIG. 1A shows the starting point for the process, wherein single crystal silicon substrate 100 containing dopant of a first conductivity type is exposed to an ambient containing silane ($SiH_4$) 102 and germine ($GeH_4$) 104 gases. FIG. 1B shows the resulting deposition of silicon-germanium alloy 106 over the surface of silicon substrate 100. FIG. 1C shows ion-implantation of dopant 108 of a second conductivity type opposite the first conductivity type into the silicon-germanium alloy 106. FIG. 1D shows the subsequent formation of polysilicon layer 110 over doped silicon-germanium alloy 106. Polysilicon layer 110 is then doped to extremely high levels by ion-implantation of dopant 112 of the first conductivity type, as shown in FIG. 1E. FIG. 1F shows completion of fabrication of the HBT structure 114, wherein doped polysilicon layer 110 and underlying silicon-germanium alloy layer 106 are etched to provide polysilicon emitter 116 overlying and separated from single crystal silicon collector 118 by silicon-germanium base 120.

While FIGS. 1C and 1E depict introduction of conductivity-altering dopant into a semiconductor material (Si—Ge alloy 106 and polysilicon 110) utilizing ion-implantation, it is also well known to introduce dopant into semiconductor material through chemical vapor deposition (CVD) followed by furnace annealing and resulting thermal drive-in.

While satisfactory for some applications, the conventional process described above suffers from a number of disadvantages. In particular, the HBT emitter must contain an extremely high concentration of dopant, on the order of $10^{20}$–$10^{21}$ atoms/cm$^3$, in order to provide sufficient numbers of charged carriers for the device to function at high switching speeds. The maximum dopant concentrations obtainable by conventional doping techniques, such as ion-implantation or CVD, followed by thermal drive-in, are limited by physical mechanisms such as clustering. These mechanisms prevent the uniform incorporation of large numbers of dopant ions into the silicon lattice. The resulting uneven dopant distribution within the lattice adversely affects the electrical resistance and other important characteristics of the doped semiconductor material.

Therefore, there is a need in the art for a process for introducing extremely high levels of dopant uniformly within a crystalline semiconductor material.

SUMMARY OF THE INVENTION

The present invention provides a method of introducing extremely high levels of dopant uniformly within a crystalline semiconductor material. In accordance with the invention, spin-on-glass film containing high dopant concentrations is first formed over the semiconductor material. Next, an anti-reflective coating is formed over the doped spin-on-glass film. Exposure to radiation from an excimer laser heats the spin-on-glass and underlying semiconductor material to extremely high temperatures. Melting the SOG film and semiconductor material promotes diffusion of dopant, which, upon cooling and recrystallization of the semiconductor material, becomes uniformly incorporated within the semiconductor crystal lattice. The anti-reflective coating suppresses reflection of the laser beam and thereby promotes the efficient transfer of energy to melt the underlying doped spin-on-glass and semiconductor material.

In one embodiment of a method of introducing dopant into a semiconductor material, a doped layer is formed over a semiconductor material, forming an anti-reflective coating over the doped layer. A laser beam is then applied to the anti-reflective coating to melt the underlying doped layer and the semiconductor material and cause dopant from the doped layer to diffuse into the melted semiconductor material. The laser beam is then removed from the anti-reflective coating to cause the melted semiconductor material to solidify and incorporate a high concentration of diffused dopant.

The features and advantages of the present invention will be more fully understood upon consideration of the following detailed description of the invention and the accompanying drawings.

DETAILED DESCRIPTION

U.S. Pat. No. 4,415,383, which issued to Naem et al. on Nov. 15, 1983, entitled "Method of Fabricating Semiconductor Devices Using Laser Annealing," is hereby incorporated by reference. The Naem et al. patent describes recrystallization of polysilicon melted by a laser beam to form thermally stable, ordered crystalline silicon. Melting and recrystallization of the silicon is promoted by the presence of an anti-reflective coating (ARC) over the polysilicon prior to exposure to the laser radiation. The ARC suppresses reflection of the laser beam by the polysilicon, thereby promoting efficient transfer of energy from the laser beam to the underlying polysilicon material. This efficient energy transfer results in the ARC-coated semiconductor material being heated to higher temperatures than would otherwise result from application of the laser energy.

The present invention utilizes ARC and exposure to laser radiation to introduce very high concentrations of conductivity-altering dopant into semiconductor material.

FIGS. 2A–2D show cross-sectional views of an embodiment of a process flow in accordance with the present invention for forming an extremely highly doped polysilicon layer.

Figure 1A:
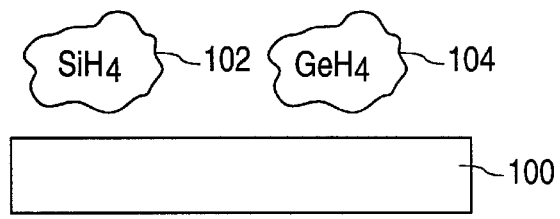
FIGS. 1A–1F are cross-sectional views illustrating a conventional process flow for forming an HBT device.
Figure 1B:
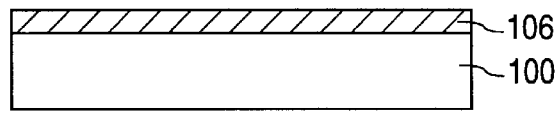
Figure 1C:
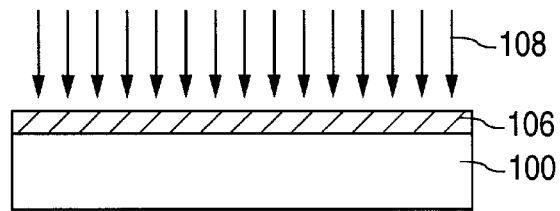
Figure 1D:
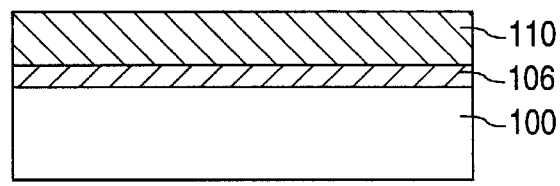
Figure 1E:
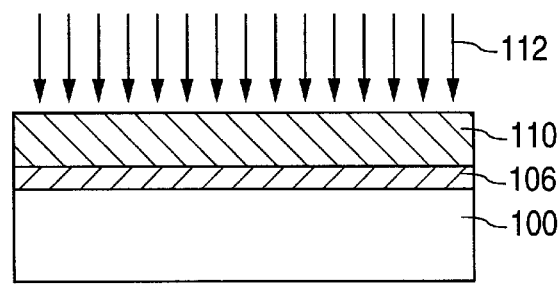
Figure 1F:
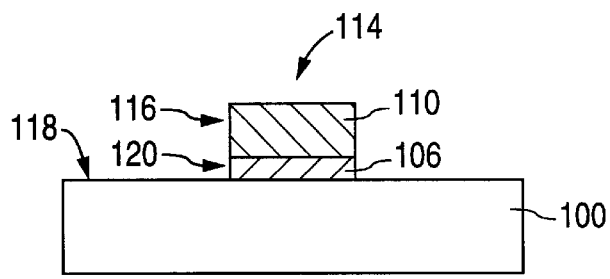
Figure 2A:
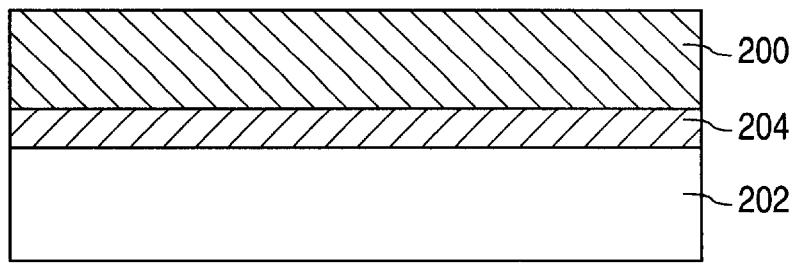
FIGS. 2A–2D are cross-sectional views illustrating a first embodiment of a process flow in accordance with the present invention for forming an extremely highly doped polysilicon layer.

FIG. 2A shows the starting point of the process, wherein undoped polysilicon layer 200 overlies and is separated from single crystal silicon substrate 202 by silicon-germanium alloy layer 204. Single crystal silicon substrate 202 includes conductivity-altering dopant of a first conductivity type.

Silicon-germanium alloy layer 204 includes dopant of a second conductivity type opposite the first conductivity type.

Figure 2B:
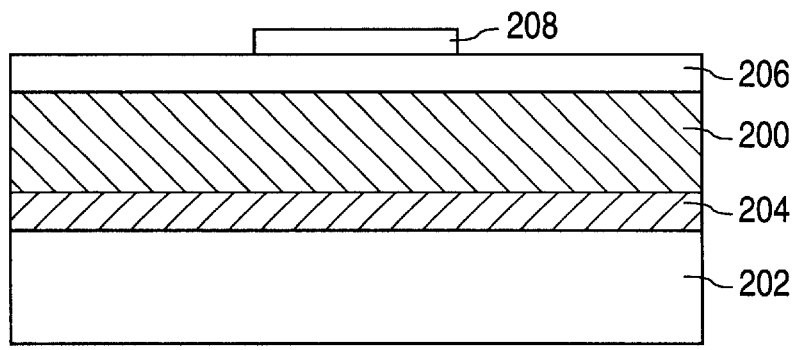

FIG. 2B shows the next step in the process flow, wherein dopant-containing spin-on-glass (SOG) layer 206 is formed over undoped polysilicon layer 200. Spinon-glass layer 206 includes high concentrations of dopant of the first conductivity type, and may be composed of materials such as phosphosilicate glass (PSG), borophosphosilicate glass (BPSG), or a like material containing arsenic or antimony as the dopant species. FIG. 2B also shows the patterning of an anti-reflective coating (ARC) layer 208 over a selected region of doped spin-on-glass layer 206. ARC 208 may be composed of a variety of materials, including silicon nitride, silicon oxynitride, titanium nitride, or organic polymers.

Figure 2C:
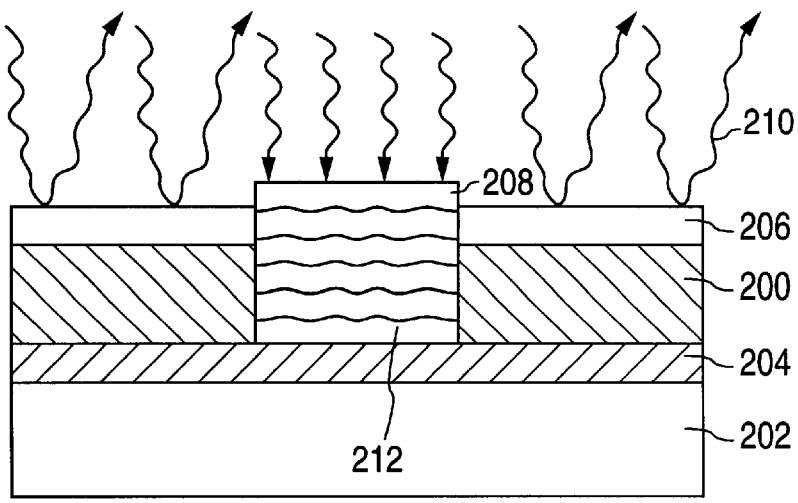

FIG. 2C shows the exposure of the FIG. 2B structure to laser radiation 210. Laser radiation 210 is provided by a conventional excimer laser having a wavelength in the deep-ultraviolet region of the spectrum. Examples of such excimer lasers include XeCl lasers having an output wavelength of 308 nm, KrF lasers having an output wavelength of 248 nm, and ArF lasers having an output wavelength of 198 nm. Exposure to radiation at such short wavelengths is important to ensure heating and melting of only shallow portions of exposed dopant source and semiconductor materials.

FIG. 2C shows that spin-on-glass regions bearing ARC 208 absorb a substantial amount of the energy of laser beam 210. The efficient transfer of energy from the incident laser beam 210 to the underlying spin-on-glass material 206 is the result of suppression of laser reflection by ARC 208. As doped spin-on-glass film 206 and polysilicon 200 underlying ARC 208 absorb energy, they form a melt 212 in which the dopant diffuses into the silicon. Melt 212 is typically heated by exposure to the laser radiation to over 1400 °C.

As further shown in FIG. 2C, in spin-on-glass regions 200 uncoated by anti-reflective coating 208, laser radiation 210 is partially reflected. In these uncoated regions, energy from laser beam 208 is not efficiently transferred to the underlying spin-on-glass 206 and polysilicon 200, and little or no melting and diffusion occurs in these regions.

Figure 2D:
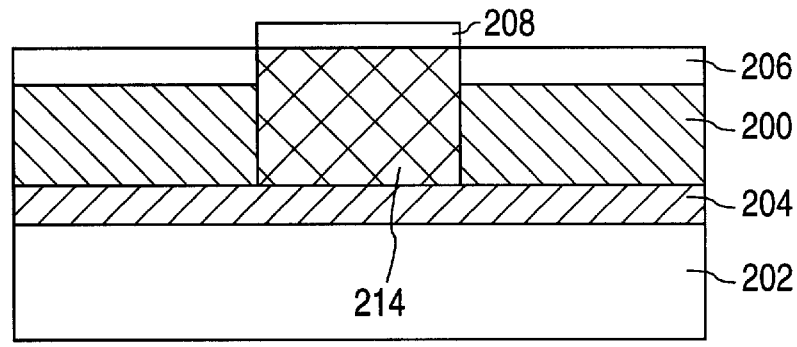

FIG. 2D shows that removal of the laser radiation causes the silicon melt to solidify as crystalline silicon 214. During this crystallization process, the silicon incorporates dopant from the melted SOG film into its lattice structure. Utilizing the doping process in accordance with the present invention, the crystalline silicon can receive uniform dopant concentrations of $1 \times 10^{20} - 1 \times 10^{21}$ atoms/cm$^3$.

Subsequent etching of ARC material selective to the underlying crystalline silicon completes formation of an HBT device featuring the highly doped polysilicon layer as the emitter, the silicon-germanium alloy as the base, and the single crystal silicon workpiece as the collector.

Introducing high concentrations of dopant into semiconductor material in accordance with the present invention offers a number of important advantages over conventional processes.

One important advantage is that dopant can be evenly incorporated into the semiconductor material in extremely high concentrations. This is because high temperatures generated by absorption of laser radiation by the ARC results in a homogenous distribution of dopant within the silicon melt. Upon recrystallization, this dopant is evenly incorporated within the silicon lattice.

Another advantage of the process is the ability to introduce dopant into semiconductor material with a high degree of selectivity. By carefully patterning the ARC layer, generation of high temperatures, and hence the location of melting and dopant diffusion, can be precisely controlled.

A further important advantage of the process is flexibility. By varying the thickness/composition of the ARC, the concentration of dopant in the source material, and/or the characteristics of the applied laser (e.g., pulse energy, wavelength, duration, and/or repetition rate), semiconductor materials having various dopant concentrations can be formed.

Although the present invention has thus far been described in connection with one specific embodiment, it is not intended that the invention be limited to this particular embodiment. Various modifications and alterations in the structure and process will be apparent to those skilled in the art without departing from the scope of the invention.

For example, while the embodiment of the invention described above with respect to FIGS. 2A–2D describes introduction of high concentrations of dopant into polysilicon, the invention is not limited to the doping of polysilicon. In keeping with the concepts of the present invention, high concentrations of dopant can be introduced into a variety of semiconductor materials in the manner described, including single crystal silicon, gallium arsenide, silicon-germanium, and germanium.

Moreover, while the embodiment of the invention discussed above with respect to FIGS. 2A–2D depicts diffusion of dopant from a melted spin-on-glass source material, the invention is not limited to such a dopant source. Any dopant-containing material capable of being melted by applied laser radiation would be suitable for use in accordance with the present invention.

Given the above detailed description of the invention and the variety of embodiments described therein, it is intended that the following claims define the scope of the present invention, and that methods within the scope of these claims and their equivalents be covered hereby.

What is claimed is:

1. A method of introducing dopant into a semiconductor material comprising:

forming a doped layer over a semiconductor material;

forming an anti-reflective coating over the doped layer;

applying a laser beam to melt the doped layer and the semiconductor material, thereby causing dopant from the doped layer to diffuse into the melted semiconductor material; and removing the laser beam to cause the melted semiconductor material to solidify and incorporate a high concentration of diffused dopant into the solidified semiconductor material.

2. A method according to claim 1, and wherein the step of forming a doped layer comprises forming doped phosphosilicate glass over single crystal silicon.

3. A method according to claim 1, and wherein the step of forming a doped layer comprises forming doped borophosphosilicate glass over single crystal silicon.

4. A method according to claim 1, and wherein the step of forming a doped layer comprises forming doped phosphosilicate glass over polysilicon.

5. A method according to claim 1, and wherein the step of forming a doped layer comprises forming doped borophosphosilicate glass over polysilicon.

6. A method according to claim 1, and wherein the step of forming a doped layer comprises forming a spin-on-glass layer including arsenic over single crystal silicon.

7. A method according to claim 1, and wherein the step of forming a doped layer comprises forming a spin-on-glass layer including arsenic over polysilicon.

8. A method according to claim 1, and wherein the step of forming a doped layer comprises forming a spin-on-glass layer including antimony over single crystal silicon.

9. A method according to claim 1, and wherein the step of forming a doped layer comprises forming a spin-on-glass layer including antimony over polysilicon.

10. A method according to claim 1, and wherein the step of forming an anti-reflective coating comprises forming silicon nitride.

11. A method according to claim 1, and wherein the step of forming an anti-reflective coating comprises forming silicon oxynitride.

12. A method according to claim 1, and wherein the step of forming an anti-reflective coating comprises forming titanium nitride.

13. A method according to claim 1, and wherein the step of forming an anti-reflective coating comprises forming an organic polymer.

14. A method according to claim 1, and wherein the step of applying a laser beam heats the semiconductor material to above approximately 1400°C.

15. A method according to claim 1, and wherein the step of removing the laser beam causes the semiconductor material to solidify and to incorporate dopant at a concentration of between about $1 \times 10^{20}$ and $1 \times 10^{21}$ atoms/cm$^3$.

16. A method according to claim 1, and further comprising the step of varying at least one of the process parameters selected from the group consisting of ARC thickness, ARC composition, concentration of dopant in the doped material, laser pulse energy, laser pulse wavelength, laser pulse duration, and laser pulse repetition rate, in order to introduce a desired concentration of dopant into the semiconductor material.

17. A method according to claim 1, and wherein the step of applying a laser beam comprises applying an excimer laser beam having a wavelength of one of 193 nm, 248 nm, and 308 nm.

* * * * *